United States Patent
Uchibori et al.

(10) Patent No.: US 8,975,092 B2
(45) Date of Patent: Mar. 10, 2015

(54) METHOD AND SYSTEM FOR CONTROLLING CHIP WARPAGE DURING BONDING

(71) Applicant: Fujitsu Limited, Kanagawa (JP)

(72) Inventors: Chihiro Uchibori, Campbell, CA (US); Michael G. Lee, Saratoga, CA (US)

(73) Assignee: Fujitsu Limited, Kawasaki-shi (JP)

( * ) Notice: Subject to any disclaimer, the term of this patent is extended or adjusted under 35 U.S.C. 154(b) by 193 days.

(21) Appl. No.: 13/685,404

(22) Filed: Nov. 26, 2012

(65) Prior Publication Data
US 2014/0145324 A1    May 29, 2014

(51) Int. Cl.
*H01L 21/66* (2006.01)
*H01L 23/48* (2006.01)
*H01L 23/00* (2006.01)

(52) U.S. Cl.
CPC ............. *H01L 22/10* (2013.01); *H01L 23/48* (2013.01); *H01L 2224/16225* (2013.01); *H01L 24/16* (2013.01); *H01L 2224/81815* (2013.01); *H01L 2924/3511* (2013.01); *H01L 23/562* (2013.01)

USPC ............... 438/5; 438/106; 438/456; 438/597; 257/737; 257/773; 257/704; 257/E21.499; 257/E23.021

(58) Field of Classification Search
USPC .............. 438/5, 106, 456, 597; 257/737, 773, 257/704, E21.499, E23.02, 685
See application file for complete search history.

(56) References Cited

U.S. PATENT DOCUMENTS

2014/0077382 A1*    3/2014    Kwon et al. ................... 257/773

* cited by examiner

*Primary Examiner* — Cathy N Lam
(74) *Attorney, Agent, or Firm* — Baker Botts L.L.P.

(57) ABSTRACT

A semiconductor assembly includes a first substrate and a chip. The chip is coupled to and spaced apart from the substrate. Further, the chip has a first surface facing the substrate. The chip also has a warpage profile indicating stress imparted on the chip following a reflow operation. The assembly includes a back layer disposed on the chip on a second surface substantially opposite from the first surface. The back layer has a non-uniform thickness. Additionally, the thickness of the back layer on each of a plurality of elements of the chip is based on the warpage profile.

13 Claims, 3 Drawing Sheets

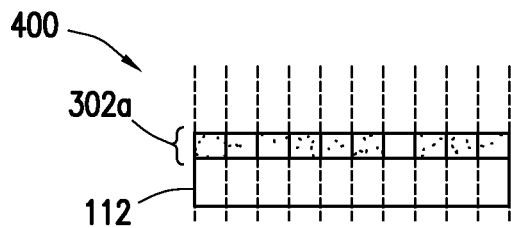
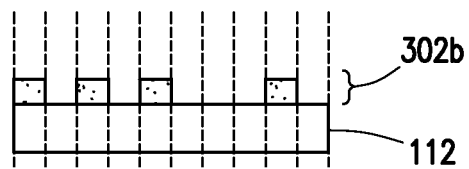
FIG. 4a          FIG. 4b
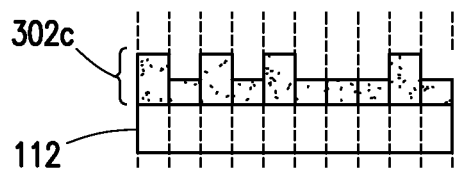
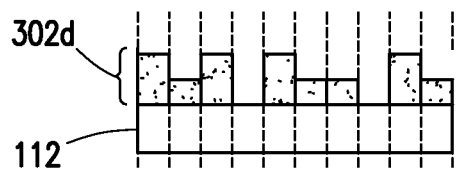
FIG. 4c          FIG. 4d
FIG. 4e
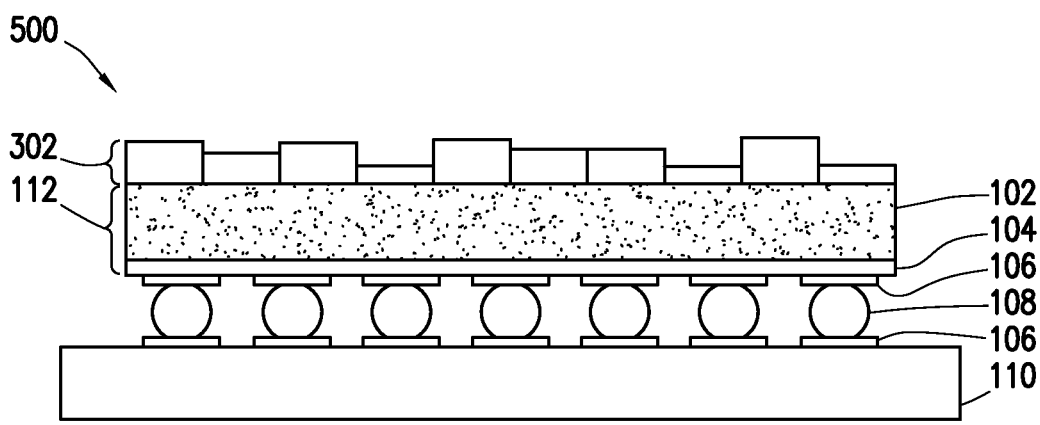
FIG. 5

US 8,975,092 B2

METHOD AND SYSTEM FOR CONTROLLING CHIP WARPAGE DURING BONDING

TECHNICAL FIELD

The present invention generally relates to flip-chip mounting and, more particularly, to a method and system for controlling chip warpage during bonding.

BACKGROUND

In a semiconductor device assembly, a semiconductor die (also referred to as an integrated circuit (IC) chip or die) may be bonded directly to a packaging substrate. Such chips may be formed with ball-shaped beads or bumps of solder affixed to their I/O bonding pads. The semiconductor device assembly may be directly bonded to a printed circuit board (PCB) using a similar solder joining operation. During cooling, the chips and/or the assembly package may become warped due to coefficient of thermal expansion (CTE) mismatch between the chip, on-chip devices, and/or assembly package. Warpage is a global phenomenon, and the larger the package or chip is, the more warpage it will experience. As a result, solder providing electrical and mechanical bonds between the chip and the packaging substrate may not provide connections as originally designed.

SUMMARY

In particular embodiments, a semiconductor assembly includes a first substrate and a chip. The chip is coupled to and spaced apart from the substrate. Further, the chip has a first surface facing the substrate. The chip also has a warpage profile indicating stress imparted on the chip following a reflow operation. The assembly includes a back layer disposed on the chip on a second surface substantially opposite from the first surface. The back layer has a non-uniform thickness. Additionally, the thickness of the back layer on each of a plurality of elements of the chip is based on the warpage profile.

In another embodiment, a method for controlling warpage of a semiconductor assembly includes determining a warpage profile of a chip coupled to and spaced apart from a substrate. The chip has a first surface facing the substrate. The warpage profile indicates stress imparted on the chip following a reflow operation. The method also includes estimating a total warpage for the chip based on the warpage profile. The total warpage is based on a first gap between the chip and a substrate proximate the center of the chip and a second gap between the chip and the substrate proximate an edge of the chip. Further, based on whether the total warpage is greater than a pre-determined amount, the method includes disposing a back layer on the chip on a second surface substantially opposite from the first surface. The back layer has a non-uniform thickness. Additionally, the thickness of the back layer on each of a plurality of elements of the chip is based on the warpage profile.

In another embodiment, a method for providing a semiconductor assembly includes providing a substrate. The method further includes providing a chip coupled to and spaced apart from the substrate. The chip has a first surface facing the substrate. The method includes disposing a back layer on the chip on a second surface substantially opposite from the first surface. The back layer has a non-uniform thickness. The thickness of the back layer is based on determining a warpage profile of the chip. The warpage profile indicates stress imparted on the chip following a reflow operation. The thickness of the back layer is also based on estimating a total warpage for the chip based on the warpage profile. The total warpage is based on a first gap between the chip and a substrate proximate the center of the chip and a second gap between the chip and the substrate proximate an edge of the chip. Further, based on whether the total warpage is greater than a pre-determined amount, disposing the thickness of the back layer on each of a plurality of elements of the chip based on the warpage profile.

The object and advantages of the invention will be realized and attained by means of at least the features, elements, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 4(a) through 4(e) illustrates sections of example chip assemblies in stages of manufacture of a back layer of non-uniform thickness, in accordance with one embodiment of the present disclosure;

FIG. 5 illustrates a section of an example semiconductor assembly with a back layer of non-uniform thickness, in accordance with one embodiment of the present disclosure.

DETAILED DESCRIPTION

Embodiments of the present invention and its advantages are best understood by referring to FIGS. 1-6 of the drawings, like numerals being used for like and corresponding parts of the various drawings.

Figure 1:
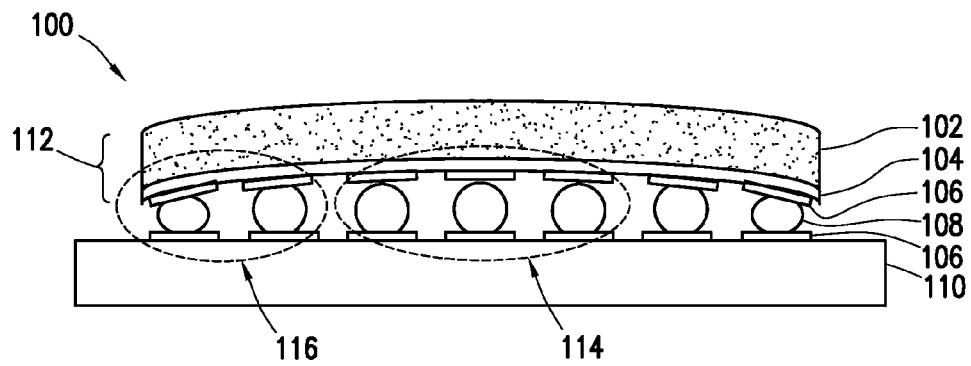
FIG. 1 illustrates a section of an example semiconductor assembly, in accordance with one embodiment of the present disclosure.

FIG. 1 illustrates a section of an example semiconductor assembly 100, in accordance with one embodiment of the present disclosure. Semiconductor assembly 100 may include package 110 and chip 112. Semiconductor assembly 100 may be a device in which one or more electrical and/or optical chips 112 may be coupled to package 110, which may also be called a "substrate." Package 110 may be coupled to a printed circuit board (PCB) (not expressly shown) or any other suitable board. During packaging, chips 112 may be "flipped" onto their active circuit surface so that solder bumps 108 form electrical connections directly between the chip and conductive pads or traces on a package or substrate. Chips 112 of this type may be commonly called "flip chips." Accordingly, semiconductor assembly 100 may also be referred to as a "flip-chip package" or "flip-chip assembly."

Typically, to couple chips 112 to package 110, solder bumps 108 may be applied to the surface of chips 112. Chips 112 and solder bumps 108 may be aligned over package 110 such that each solder bump 108 at least partially fills an associated bond pad 106 on package 110, and such that chip 112 may be spaced apart from package 110.

Solder bumps 108 may include any suitable material operable to interconnect chips 112 to package 110. According to various embodiments, solder bumps 108 may include any suitable conductive material such as gold, tin, lead, or copper, for example. According to some embodiments, solder bumps 108 may be replaced by other types of interconnections such as microelectronic interconnections, optical interconnections, or any other suitable interconnections.

In some embodiments, package 110 may include a solder mask (not expressly shown) that may define an opening for bond pads 106. Bond pads 106 may connect to circuitry within package 110 and/or allow package 110 to electrically (or otherwise) couple chips 112 with an external device or with one or more other components coupled to package 110. Solder mask (not expressly shown) may include any suitable non-conductive material such as polymer, for example. Bond pads 106 may include any suitable conductive material such as copper, for example. Using methods discussed below, package 110 may be coupled to chip 112 by one or more solder bumps 108 during a reflow operation or any other suitable bonding method.

In packaging, chips 112 and package 110 may be electrically connected and mechanically bonded in a solder joining or reflow operation. Heat may be applied causing solder bumps 108 to alloy and form electrical connections between chips 112 and package 110. The package may then be cooled to harden the connection. Additionally, although selected components of semiconductor assembly 100 are illustrated in FIG. 1 at a high level, other materials and coupling techniques may be used. Moreover, semiconductor assembly 100 may include any other well-known components and the techniques described herein may be applied to many varieties of semiconductor assemblies such as chip on chip, chip on substrate, electro-optic component on chip, and micro-electromechanical systems (MEMS) on chip, for example.

During cooling, chip 112 and package 110 may warp due to coefficient of thermal expansion (CTE) mismatch between chip 112 and package 110. Warpage may also result from CTE mismatch between different components of chip 112, such as silicon layer 102 and on-chip devices 104. Solder bumps 108, chip 112, and package 110 may suffer from stress due to the warpage that may reduce the reliability of semiconductor assembly 100. The bonding between chip 112 and package 110 may be unreliable due to uneven gaps between chip 112 and package 110 encountered due to warpage. For example, bonding between chip 112 and package 110 may include areas of reliable bonding 116 where solder bumps 108 provide an adequate connection between chip 112 and package 110. There may also be areas of unreliable bonding 114 where solder bumps 108 may fail to make a connection or may make an inadequate connection bonding between chip 112 and package 110 due to the warpage of chip 112 and/or package 110. Controlling the effects of warpage on chip 112 during a reflow process by keeping chip 112 approximately flat may allow a reliable bonding between chip 112 and package 110. As discussed in more detail below, warpage may be controlled by applying a back layer to chip 112.

Package 110 may include any suitable surface and may be formed of any suitable ceramic or organic material. For example, package 110 may include a plastic surface mount for chip 112. As another example, package 110 may include a second semiconductor chip that also acts as a package for chip 112. Selection of a material for package 110 may concern minimizing the CTE difference between package 110 and chip 112. For example, ceramic materials may have a CTE closer to chip 112. However, ceramic materials may be significantly more cost prohibitive than other materials. Likewise, mechanical stiffeners (not expressly shown) made of metals or ceramics may be used on package 110 to reduce warpage. Yet, like ceramic substrates, use of a metal or ceramic stiffener may require additional processing and subsequent costs. A chip holder may also be used to keep chip 112 flat during a reflow process. However, the reflow process with a chip holder may become very complicated and increase manufacturing costs. In addition, the force to constrain chip 112 may cause damage to chip 112 including damage to on-chip devices 104. When warpage causes the gap between chip 112 and package 110 to be non-uniform, larger solder bumps 108 may be used and/or bond pads 106 may be increased in size to improve the reliability of bonding. Yet, the large volume of solder may degrade the electrical reliability of the solder, e.g., may result in concerns with electro-migration resistivity.

Chip 112 may include any suitable substrate and may be formed of any suitable ceramic or organic material. Chip 112 may also be referred to generally as a "substrate" and may include any suitable device operable to perform data transmission. For example, chip 112 may perform data transmission using electric signals or optical signals. Chip 112 and may refer to a silicon chip, microelectronic chip, optoelectronic chip, MEMS chip, microchip die, integrated circuit, or any other suitable analog or digital circuitry device. In addition to bonding methods discussed above, chip 112 may be coupled to package 110 by any suitable technique, such as by flip-chip coupling, for example. Chip 112 may include multiple layers including silicon layer 102 and on-chip devices 104. On-chip devices 104 may be constructed of silicon dioxide, for example, and may be thin relative to silicon layer 102. For example, silicon layer 102 may be approximately 100-300 μm thick while on-chip devices 104 may be approximately 1.6 μm thick. Commonly, on-chip devices 104 may have a higher CTE than silicon layer 102, which may cause on-chip devices 104 to shrink more than silicon layer 102 during cooling after a solder reflow operation. On-chip devices 104 may include traces (not expressly shown) for electrical connection. Traces (not expressly shown) may be formed of any suitable material, e.g., copper, and may be distributed non-uniformly within on-chip devices 104 to accomplish the required electrical designs. The number and location of traces, also called "density," and material used to form the traces may further cause on-chip devices 104 to have a dissimilar CTE from silicon layer 102. Thus, in part due to on-chip device 104 density the warpage across a length of chip 112 may not be uniform.

Chip 112 warpage may be predicted by a mechanical simulation, e.g., finite element analysis (FEA). The predicted warpage may then be verified by experimental warpage data measured by conventional methods, e.g., shadow moiré or laser reflection. The amount of warpage experienced by chip 112 may not be uniform because on-chip device 104 interconnection density may not be uniform. Thus, chip 112, including silicon layer 102 and on-chip devices 104, may be divided into multiple sections, and based on mechanical simulation. The warpage experienced in each section, or element, may be estimated by FEA using a computer program, such as the ANSYS modeling programs produced by ANSYS, Inc. (Canonsburg, Pa.).

Figure 2:
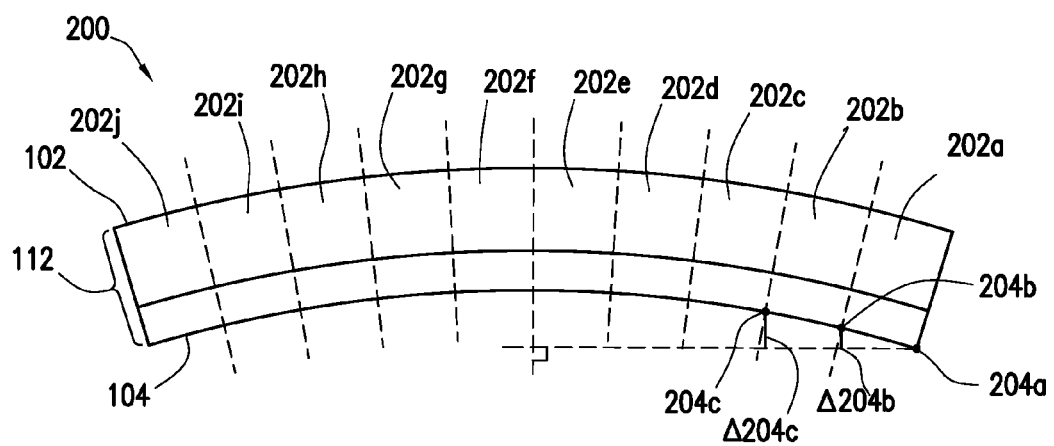
FIG. 2 illustrates a diagram of the effect of warpage on a chip, such as a chip shown in FIG. 1, in accordance with one embodiment of the present disclosure.

FIG. 2 illustrates a diagram 200 of the effect of warpage on a chip, such as chip 112 shown in FIG. 1, in accordance with one embodiment of the present disclosure. As discussed previously, as a chip experiences warpage, the amount of deviation from approximately flat may vary based on density of the on-chip devices 104 and/or other factors. The amount of warpage may be estimated using FEA by first dividing the chip into elements 202 as shown in FIG. 2. The number of elements 202 may vary based on the length of chip 112, density of on-chip devices 104, and/or any other suitable factor. Elements 202 may all be of approximately equal dimensions and/or elements 202 may be of varied dimensions. Warpage may then be calculated by the absolute value of the difference in the displacement at each end, or node, of each element 202:

$$\delta_i = |\Delta_2 - \Delta_1|;$$

where:
$\delta_i$=amount of warpage experienced by the element;
$\Delta_2$=displacement from vertical at one end, or node, of the element; and
$\Delta_1$=displacement from vertical at another end, or node, of the element.

For example, the warpage of element 202b may be determined by the equation:

$$\delta_{202b} = |\Delta_{204c} - \Delta_{204b}|;$$

where:
$\delta_{202b}$=amount of warpage experienced by element 202b;
$\Delta_{204c}$=displacement from vertical at node 204c; and
$\Delta_{204b}$=displacement from vertical at node 204b.

Figure 3:
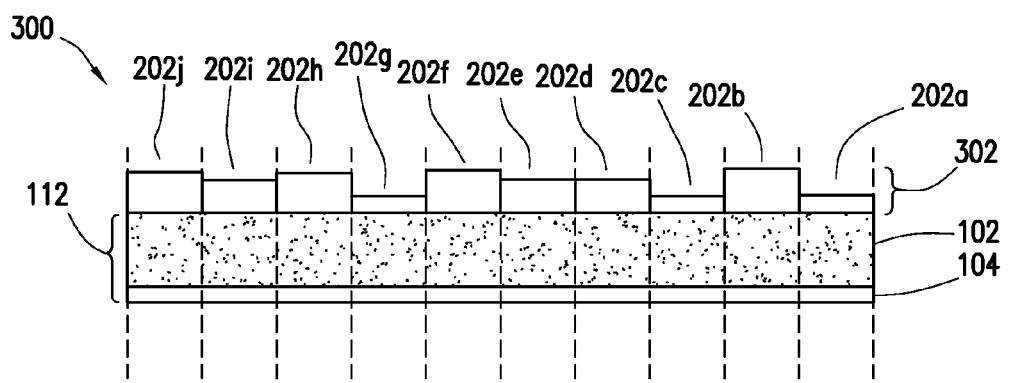
FIG. 3 illustrates a section of an example chip assembly with a back layer of non-uniform thickness, in accordance with one embodiment of the present disclosure.

After analysis is performed for each element, a warpage profile may be generated. Minimizing warpage of chip 112 may be accomplished by using a layer of material deposited on the back of chip 112, e.g., a "back layer," that may serve to control the warpage of chip 112. Accordingly, FIG. 3 illustrates a section of an example chip assembly 300 with back layer 302 of non-uniform thickness, in accordance with one embodiment of the present disclosure. The non-uniform thickness of back layer 302 may be determined using the warpage profile for chip 112. The thickness may also be determined by fabricating test chips with various thicknesses and/or with simulation. The warpage profile may be utilized to determine initial thicknesses for each element for use in the simulation. In embodiments of the present disclosure, element 202 that experiences more warpage relative to other elements 202 may necessitate a corresponding thicker back layer 302. For example, FIG. 3 illustrates that element 202b may include back layer 302 that may be thicker than back layer 302 on elements 202a or 202c. Using a simulation, thickness of back layer 302 for each element 202 may be adjusted until the amount of warpage experienced by each element 202 may be minimized. Back layer 302 may then be deposited in accordance with the simulation analysis.

Back layer 302 may be formed of any suitable polymer and/or polymer epoxy with an appropriate CTE and/or modulus of elasticity. Back layer 302 with a CTE higher than the CTE of chip 112 may serve to counteract warpage of chip 112 as the chip may be heated. As example, the CTE of a suitable polymer and/or polymer epoxy for back layer 302 may be approximately 10 to 100 times higher than the CTE of the materials used to form chip 112, e.g., silicon. For example, if the silicon used to form chip 112 has a CTE between approximately 3 ppm/K to approximately 10 ppm/K, then the material of back layer 302 may have a CTE between approximately 10 ppm/K to approximately 300 ppm/K.

As noted, in embodiments of the present disclosure, the thickness of the back layer 302 on each of the elements may vary based on the amount of warpage the particular element may experience. A relatively thicker back layer may be applied to elements that exhibit greater warpage than other elements. For example, the application of a 1 μm thick layer of back layer 302 material to an element may result in a reduction in warpage of approximately 5-10%. The addition of layer of back layer 302 material approximately 2 μm thick may result in a reduction in warpage of approximately 10-15%, while a layer approximately 4 μm thick may reduce warpage for an element by approximately 20-30%. Thus, the addition of back layer 302 of varied thickness may control and decrease warpage of individual elements, and consequently, chip 112 during and after a reflow operation.

FIGS. 4(a) through 4(e) illustrate sections of example chip assemblies 400 in stages of manufacture of back layer 302 of non-uniform thickness, in accordance with one embodiment of the present disclosure. As shown in FIG. 4(a), a layer of material may be deposited in a uniform thickness initially to create back layer 302a. In FIG. 4(b), back layer 302a may be patterned based upon the results of a warpage profile of chip 112 developed using FEA as discussed with respect to FIG. 2. This patterning may produce back layer 302b. Depending on the warpage profile of chip 112, another layer of material may be deposited onto chip 112 to generate back layer 302c as illustrated in FIG. 4(c). Then, in FIGS. 4(d) and 4(e), the second layer of material may then be patterned to create back layer 302d and a third layer may be deposited to generate back layer 302e. Accordingly, FIG. 5 illustrates a section of an example semiconductor assembly 500 with back layer 302 of non-uniform thickness, in accordance with one embodiment of the present disclosure. The resultant back layer 302 may control warpage of chip 112 during subsequent processing in order to maintain reliable connections to package 110.

Figure 6:
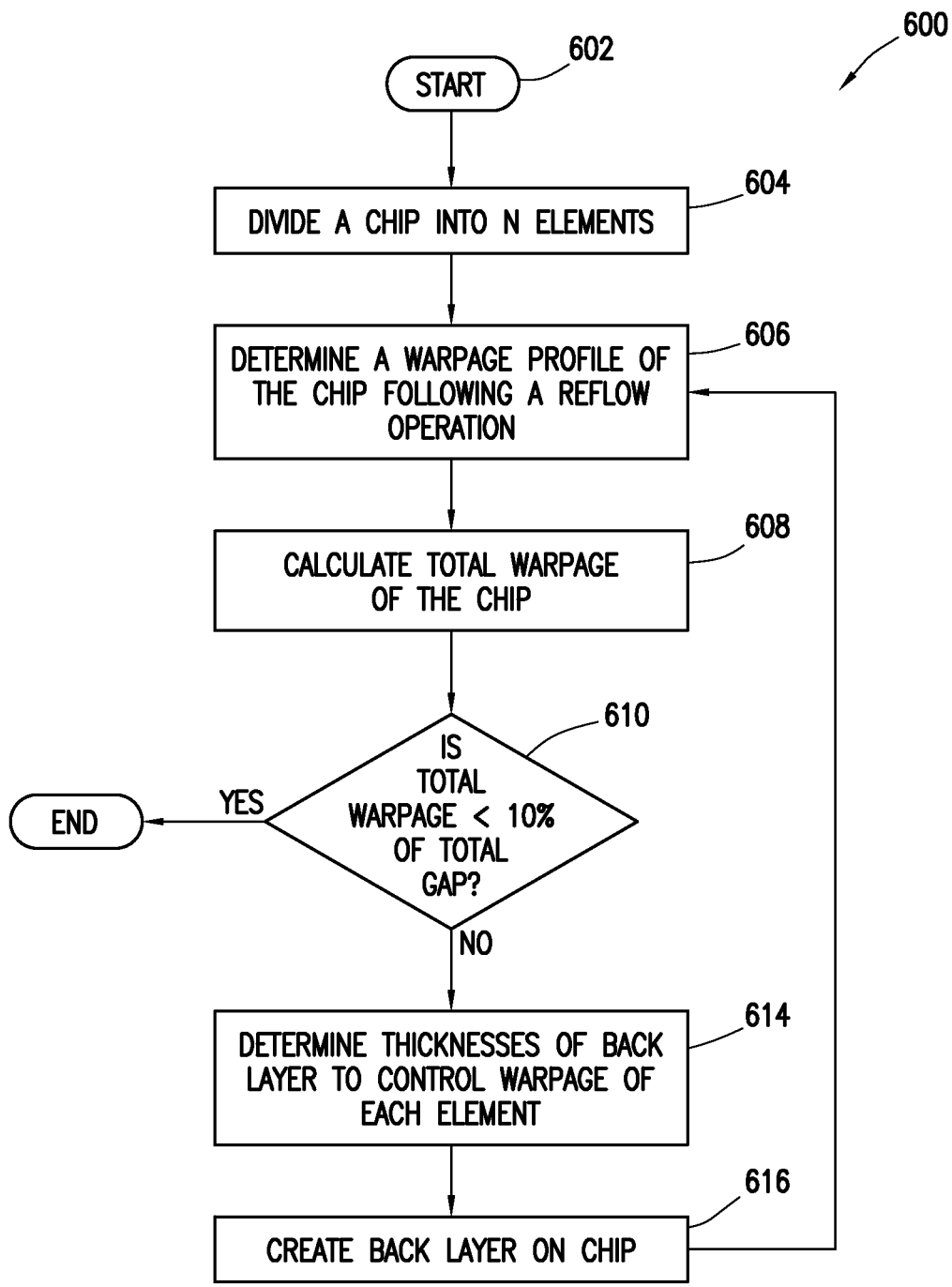
FIG. 6 illustrates a flow chart of an example method for determining back layer thickness to control stress on a chip due to warpage, in accordance with one embodiment of the present disclosure.

FIG. 6 illustrates a flow chart of an example method 600 for determining back layer thickness to control stress on a chip due to warpage, in accordance with one embodiment of the present disclosure. The steps of method 600 may be performed by various computer programs, models or any combination thereof, configured to simulate and design bonding systems and associated warpage. The programs and models may include instructions stored on computer-readable medium, and operable to perform, when executed, one or more of the steps described below. The computer-readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer-readable media. Collectively, the computer programs and models used to simulate and design semiconductor assemblies may be referred to as an "engineering tool." For illustrative purposes, method 600 is described with respect to semiconductor assembly 500 of FIG. 5; however, method 600 may be used to determine back layer thickness to control or reduce warpage of any suitable semiconductor assembly.

Method 600 may start at step 602, and at step 604, chip 112 may be divided into N elements. The number of elements may depend on the complexity and/or size of chip 112 and/or on-chip devices 104. For example, chip 112 may have dimensions of approximately 10 mm×10 mm. Additionally, N may equal five such that each element along the length of one side of chip 112 may be approximately 2 mm. As another example, N may equal two such that each element along the length of one side of chip 112 may be approximately 5 mm. For example, chip 112 may be divided into 6 elements as shown in FIG. 2 or into 10 elements as shown in FIG. 5.

At step 606, a determination may be made of a warpage profile of chip 112 following a reflow operation. A warpage profile may be generated after chip 112 has been heated to the bonding temperature and cooled. Measurement of warpage may be made by shadow moiré, laser reflection, or any other suitable method for measuring warpage. Additionally, as discussed with respect to FIG. 2, a warpage profile of chip 112 may be generated by the engineering tool using simulations and FEA of each element identified in step 604.

At step 608, the total warpage may be calculated for chip 112 by calculating the gap between chip 112 and package 110 proximate to the center of chip 112 and proximate to an edge of chip 112. The absolute value of the difference between the two measurements may approximate the total warpage of chip 112. Calculation may be made on models created by the engineering tool or may be calculated experimentally using shadow moiré, laser reflection, or any other suitable method for measuring gaps.

At step 610, a determination may be made if the total warpage identified in step 608 is less than X % of the total gap between chip 112 and package 110, where X may be based on an allowed warpage that may not excessively compromise the reliability of the connection between chip 112 and package 110. For example, X may be approximately 10% based on the stress allowed for chip 112. Thus, in this example, if the total warpage is less than approximately 10% of the total gap between chip 112 and package 110, this warpage may be acceptable and the process may end at step 612. If the gap variation is greater than 10%, the warpage may not be acceptable, and the process may continue to step 614.

At step 614, a determination may be made of the approximate thicknesses of the back layer 302 material to control or reduce the warpage of each element. The determination may be based on experimental results, FEA analysis, the warpage profile, prior simulations, and/or any other suitable method.

At step 616, back layer 302 may be created through the depositing, masking, etching, and/or other appropriate process for creating non-uniform back layer 302 profile determined at step 614. For example, material may be deposited on the back of chip 112. The deposition may be uniform and/or the layer may be deposited over a mask. The layer may then be etched or patterned and/or additional layers may be deposited and subsequently patterned until back layer 302 profile generated at step 614 may be achieved. As example, the steps shown and discussed with respect to FIGS. 4(a) through 4(e) may be completed. Following step 616, the method may then return to step 606.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A method for controlling warpage of a semiconductor assembly comprising:
   determining a warpage profile of a chip coupled to and spaced apart from a substrate, the chip having a first surface facing the substrate, the warpage profile indicating stress imparted on the chip following a reflow operation;
   estimating a total warpage for the chip based on the warpage profile, the total warpage being based on a first gap between the chip and a substrate proximate the center of the chip and a second gap between the chip and the substrate proximate an edge of the chip; and
   based on whether the total warpage is greater than a predetermined amount, disposing a back layer on the chip on a second surface substantially opposite from the first surface, the back layer having non-uniform thickness, where the thickness of the back layer on each of a plurality of elements of the chip is based on the warpage profile.

2. The method of claim 1, wherein the warpage profile is based on a finite element analysis (FEA) of each of the elements of the chip.

3. The method of claim 1, wherein the thickness of the back layer is based on a finite element analysis (FEA) of each of the elements of the chip.

4. The method of claim 1, further comprising solder bumps and bond pads, where the reflow operation comprises a reflow of the solder bumps to couple the chip to the substrate.

5. The method of claim 1, wherein the back layer comprises a polymer.

6. The method of claim 1, wherein the back layer comprises a polymer epoxy.

7. The method of claim 1, wherein the back layer comprises a material with a coefficient of thermal expansion (CTE) at least 10 times the CTE of the chip.

8. A method for providing a semiconductor assembly comprising:
   providing a substrate;
   providing a chip coupled to and spaced apart from the substrate, the chip having a first surface facing the substrate; and
   disposing a back layer on the chip on a second surface substantially opposite from the first surface, the back layer having non-uniform thickness, where the thickness of the back layer is based on:
   determining a warpage profile of the chip, the warpage profile indicating stress imparted on the chip following a reflow operation;
   estimating a total warpage for the chip based on the warpage profile, the total warpage being based on a first gap between the chip and a substrate proximate the center of the chip and a second gap between the chip and the substrate proximate an edge of the chip; and
   based on whether the total warpage is greater than a predetermined amount, disposing the thickness of the back layer on each of a plurality of elements of the chip based on the warpage profile.

9. The method of claim 8, wherein the warpage profile is based on a finite element analysis (FEA) of each of the elements of the chip.

10. The method of claim 8, wherein the thickness of the back layer is based on a finite element analysis (FEA) of each of the elements of the chip.

11. The method of claim 8, wherein the back layer comprises a polymer.

12. The method of claim 8, wherein the back layer comprises a polymer epoxy.

13. The method of claim 8, wherein the back layer comprises a material with a coefficient of thermal expansion (CTE) at least 10 times the CTE of the chip.

* * * * *